US012808390B2

(12) United States Patent
Singh et al.

(10) Patent No.: US 12,808,390 B2
(45) Date of Patent: Nov. 24, 2026

(54) PASSIVE METAMATERIALS-BASED ACOUSTIC SOUND SUPPRESSION MODULES FOR SERVERS

(71) Applicant: Dell Products L.P., Round Rock, TX (US)

(72) Inventors: Tejinder Singh, Manotick (CA); Kan Wang, Ottawa (CA); Navjot Kaur Khaira, Manotick (CA)

(73) Assignee: DELL PRODUCTS L.P., Round Rock, TX (US)

( * ) Notice: Subject to any disclaimer, the term of this patent is extended or adjusted under 35 U.S.C. 154(b) by 218 days.

(21) Appl. No.: 18/811,170

(22) Filed: Aug. 21, 2024

(65) Prior Publication Data

US 2026/0055780 A1 Feb. 26, 2026

(51) Int. Cl.
*F04D 29/66* (2006.01)
*B33Y 80/00* (2015.01)
*H05K 7/20* (2006.01)

(52) U.S. Cl.
CPC ............ *F04D 29/665* (2013.01); *B33Y 80/00* (2014.12); *H05K 7/20736* (2013.01)

(58) Field of Classification Search
CPC .... F04D 29/665; B33Y 80/00; H05K 7/20736
USPC .......................................................... 181/202
See application file for complete search history.

(56) References Cited

U.S. PATENT DOCUMENTS 3,980,912 A * 9/1976 Panza ...................... H02K 5/24 181/202
5,457,291 A * 10/1995 Richardson .......... G10K 11/172 181/294
6,104,608 A * 8/2000 Casinelli ................ F24F 13/24 181/224
7,712,576 B2 * 5/2010 Goto ...................... G06F 1/182 181/205

(Continued)

OTHER PUBLICATIONS

"APC NetShelter Soundproof, 32U, Server Rack Enclosure, 120V, Maple [TAA]—AR4032A" Schneider Electric. [https://www.se.com/us/en/product/AR4032A/apc-netshelter-soundproof-32u-server-rack-enclosure-120v-maple-taa/] retrieved Feb. 9, 2026, 15 pages.

(Continued)

*Primary Examiner* — Forrest M Phillips
(74) *Attorney, Agent, or Firm* — Amin, Turocy & Watson, LLP

(57) ABSTRACT

The technology described herein is directed towards one or more modular metasurfaces arranged with unit cells for sound absorption, in which the unit cells are based on Helmholtz resonators that are deployed proximate to a server, without substantially obstructing airflow from the server fan(s). Each sound absorbing unit-cells is designed and constructed based on a specific resonance frequency, and includes a neck portion and air chamber dimensioned to resonate at the desired resonance frequency and thereby inverse phase cancel corresponding narrowband frequencies of incoming sound waves. The metasurfaces can be arranged in a modular frame structure of surrounding unit cells, positioned behind the server's fan(s), with an opening in the (Continued)

frame structure to facilitate airflow therethrough, without obstructing or substantially obstructing the airflow to the surrounding environment.

20 Claims, 10 Drawing Sheets

(56) References Cited

U.S. PATENT DOCUMENTS

| | | | | |
|---|---|---|---|---|
| 8,485,310 | B2 * | 7/2013 | Tanabe | G10K 11/172 454/262 |
| 8,640,819 | B2 * | 2/2014 | Seedorf | F04C 29/066 181/205 |
| 8,657,066 | B2 * | 2/2014 | Doneker | B32B 33/00 174/105 R |
| 8,714,304 | B2 * | 5/2014 | Kitamura | G10K 11/002 181/293 |
| 2006/0185931 | A1 * | 8/2006 | Kawar | G06F 1/18 181/205 |
| 2011/0155503 | A1 * | 6/2011 | Joshi | G06F 1/20 181/224 |
| 2023/0286639 | A1 * | 9/2023 | Mendoza | F02K 1/827 |
| 2025/0201225 | A1 | 6/2025 | Singh et al. | |

OTHER PUBLICATIONS

"Quiet-Duct® Silencers—A Complete Range of Engineered Noise Control for Air Handling Systems" iac acoustics. [https://www.iacacoustics.com/files/content/literature/hvac-silencers/Duct-Silencer-Brochure.pdf] retrieved Feb. 9, 2026, 8 pages.

* cited by examiner

PASSIVE METAMATERIALS-BASED ACOUSTIC SOUND SUPPRESSION MODULES FOR SERVERS

BACKGROUND

Acoustic absorbers are specialized materials or structures designed to mitigate the effects of sound reflections, echoes, and reverberations in various environments. These absorbers function by capturing sound waves and converting their energy into heat, effectively reducing the intensity of the sound waves and preventing them from bouncing off surfaces and causing unwanted sound reflections. They are typically engineered using porous materials with intricate structures that allow sound waves to penetrate deep into the material, where the acoustic energy is dissipated as thermal energy through friction and air resistance.

Existing acoustic absorbers come in various forms, including foam panels, fabric-wrapped panels, diffusers, bass traps, and more. One of the problems with existing acoustic absorbers is that they are not desirable in certain heat-sensitive environments. For example, servers generate a lot of heat and thus are designed with fans to cool dissipate the heat; however, fans can generate a lot of annoying noise. Using existing acoustic absorbers to absorb server noise reduces the noise, but can significantly reduce dissipation of the heat generated by servers, which can result in high heat levels that can reduce server performance and possibly cause a server to shut down to avoid damage from overheating.

BRIEF DESCRIPTION OF THE DRAWINGS

The technology described herein is illustrated by way of example and not limited in the accompanying figures in which like reference numerals indicate similar elements and in which.

DETAILED DESCRIPTION

Figure 1:
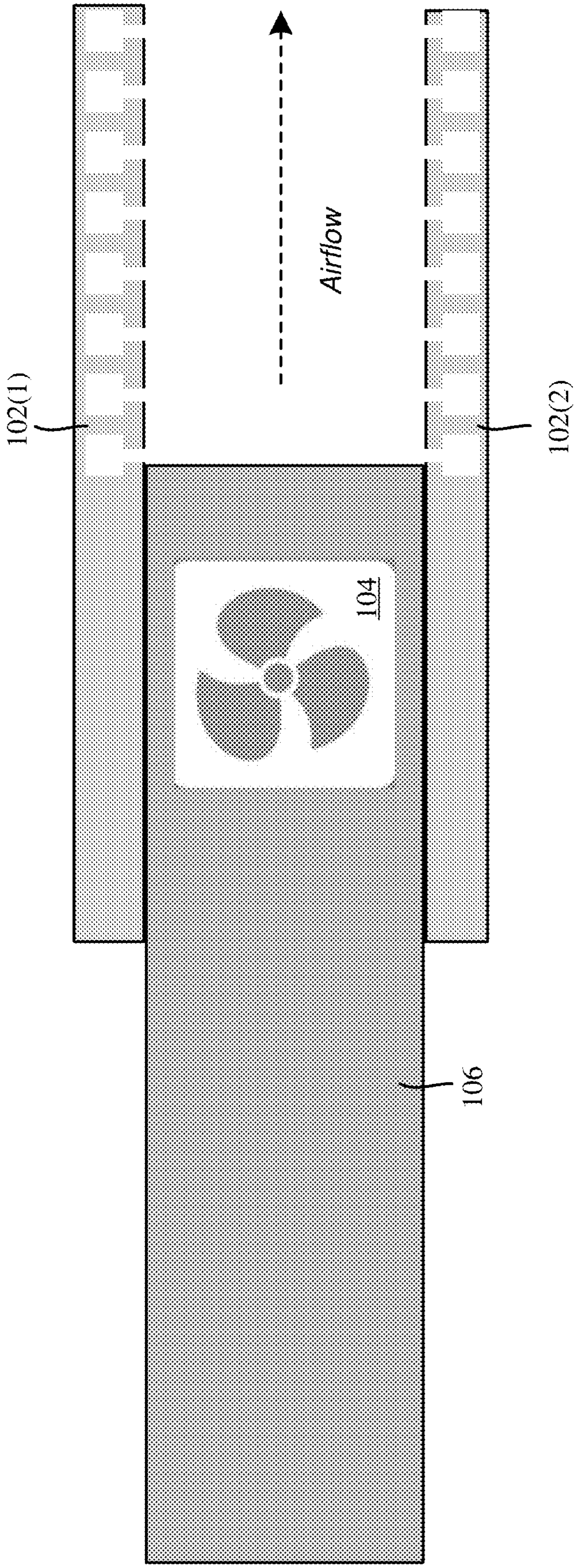
FIG. 1 is a side-view representation of example metasurfaces with Helmholtz resonator unit cells deployed as metasurface modules extending behind a server for noise cancellation of air emanating from a server fan without obstructing the airflow therefrom, in accordance with various example embodiments and implementations of the subject disclosure.

Various embodiments and implementations of the technology described herein are generally directed towards a sound absorbing device based on inverted phase cancellation, and more particularly towards one or more metasurface modules including Helmholtz resonators deployed proximate to and extending behind a server. In one implementation, the metasurface modules are configured to be deployed in a frame structure attached to a server housing, with unit cells generally extending behind the server and its fan or fans. The frame structure includes an opening through with air flows from the server's fan or fans to the surrounding environment, substantially unobstructed by the metasurfaces.

The technology described herein facilitates the design and implementation of such unit cells into metasurfaces that can be configured and positioned to efficiently absorb and dissipate sound waves of a specific frequency. Significantly, the use of metasurfaces as described herein do not increase the heat levels of computing devices substantially compared to existing technologies for sound absorption that do not facilitate ventilation/do not dissipate the heat very well. The specific frequency can be of any frequency/narrowband frequency range over a broad range of audible frequencies, or even subsonic (below 20 Hz)/supersonic frequencies (up to about 20,000 Hz).

Reference throughout this specification to "one embodiment," "an embodiment," "one implementation," "an implementation," etc. means that a particular feature, structure, or characteristic described in connection with the embodiment/implementation is included in at least one embodiment/implementation. Thus, the appearances of such a phrase "in one embodiment," "in an implementation," etc. in various places throughout this specification are not necessarily all referring to the same embodiment/implementation. Furthermore, the particular features, structures, or characteristics may be combined in any suitable manner in one or more embodiments/implementations. It also should be noted that terms used herein, such as "optimize," "optimization," "optimal," "optimally" and the like only represent objectives to move towards a more optimal state, rather than necessarily obtaining ideal results. For example, "optimal" placement of a subnet means selecting a more optimal subnet over another option, rather than necessarily achieving an optimal result. Similarly, "maximize" means moving towards a maximal state (e.g., up to some processing capacity limit), not necessarily achieving such a state.

Further, it is to be understood that the present disclosure will be described in terms of a given illustrative architecture; however, other architectures, structures, substrate materials and process features, and steps can be varied within the scope of the present disclosure.

It will also be understood that when an element such as a layer, region or substrate is referred to as being "on" or "over" another element, it can be directly on the other element or intervening elements can also be present. In contrast, only if and when an element is referred to as being "directly on" or "directly over" another element, are there no intervening element(s) present. Note that orientation is generally relative; e.g., "on" or "over" can be flipped, and if so, can be considered unchanged, even if technically appearing to be under or below/beneath when represented in a flipped orientation. It will also be understood that when an element is referred to as being "connected" or "coupled" to another element, it can be directly connected or coupled to the other element or intervening elements can be present. In contrast, only if and when an element is referred to as being "directly connected" or "directly coupled" to another element, are there no intervening element(s) present.

FIG. 1 is a side view of a system 100 that includes acoustic metasurface noise suppression modules 102(1) and 102(2) of Helmholtz resonator unit cells generally deployed behind a fan (or fans) 104 of a server 106. In general, Helmholtz resonators work by trapping and dissipating sound energy at specific frequencies, whereby as described herein, they are used for acoustic noise suppression. In this example, the modules 102(1) and 102(2) are attached to a top surface and bottom surface of the server housing, respectively, such that the unit cells extend beyond the server fan 104 with the airflow between the unit cells.

Figure 2:
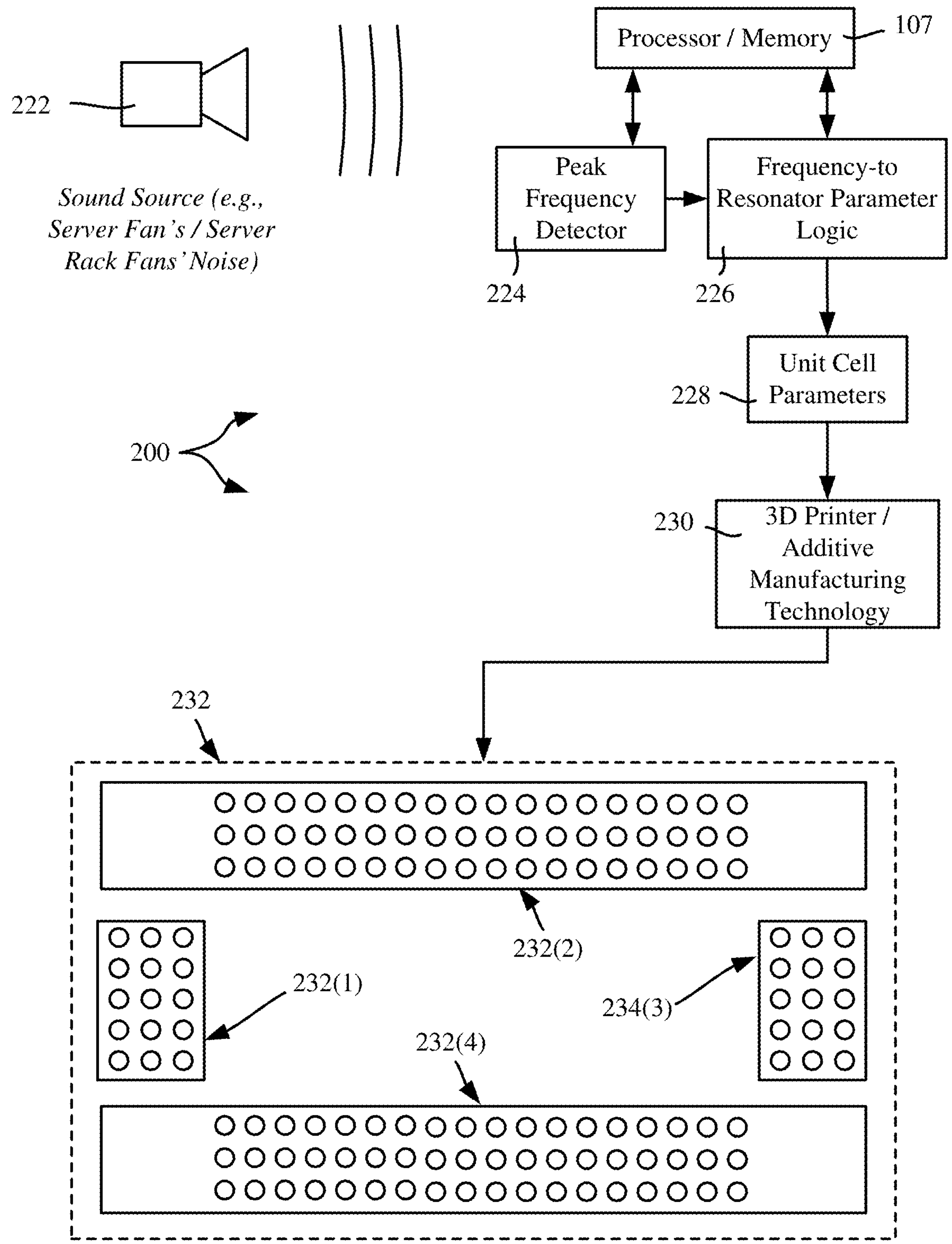
FIG. 2 is a representation of example metasurface modules designed and 3D-printed for noise cancellation, based on a detected peak frequency, in accordance with various example embodiments and implementations of the subject disclosure.

The metasurface modules 102(1) and 102(2) are thus generally parallel to and behind the 106 (including its server housing). As a result, the airflow and corresponding noise emanating from the server 106 via its server fan(s) 104, represented by the dashed arrow in FIGS. 1 and 2, is parallel to the metasurfaces and perpendicular to their unit cell resonator openings as described herein. Significantly, the airflow to the surrounding environment is substantially unobstructed by the metasurface modules 102(1) and 102(2).

FIG. 2 shows a generalized block diagram of an example metasurface design system 200 including a sound source 222 such as server fan/fans that generate undesirable noise including at a frequency (or multiple frequencies) that are to be absorbed based on the technology described herein. The design can employ various techniques, e.g., including a superposition design method, geometrical design method, and/or super-cell structures, to effectively suppress a noise frequency or frequencies; (multiple frequency cancellation can be based on using different Helmholtz resonator dimensions in the array that resonate at different frequencies to provide a multiband/wideband noise suppression). In general, a metasurface of unit cells provides an efficient noise reduction solution that enhances the acoustic environment, e.g., of server installations.

A frequency measurement tool can be used as a peak frequency detector 224 or the like to determine which approximate narrowband frequency (or multiple frequencies or wide band of frequencies) to cancel as described herein. For purposes of explanation herein, suppression of a single frequency will be described hereinafter. As will be seen, the frequency is absorbed extremely efficiently by the technology described herein. In addition to the absorbed frequency. a narrow band of nearby frequencies is also reduced to a lesser, but still desirable, extent.

Once the frequency to cancel are determined, frequency-to resonator parameter logic 226 can be used to determine the parameters 228 of unit cells that can inverse phase cancel that frequency. The parts of the unit cell can be constructed with 2D printer/additive manufacturing technology 230, that is, printing the metasurface supporting structure in conjunction with omitting printing of the unit cell resonators, which are thus air cavities. Note that as represented in FIG. 2, four metasurfaces 232(1)-232(4) result, (collectively 232) which can be printed separately or as a whole. In FIG. 2 the metasurfaces 232(1)-232(4) are depicted as flat relative to one another, however as will be understood, the metasurfaces 232(1)-232(4) will be four sides of a three-dimensional (3D) frame structure that is configured to be deployed behind the server's fan(s).

Figure 3:
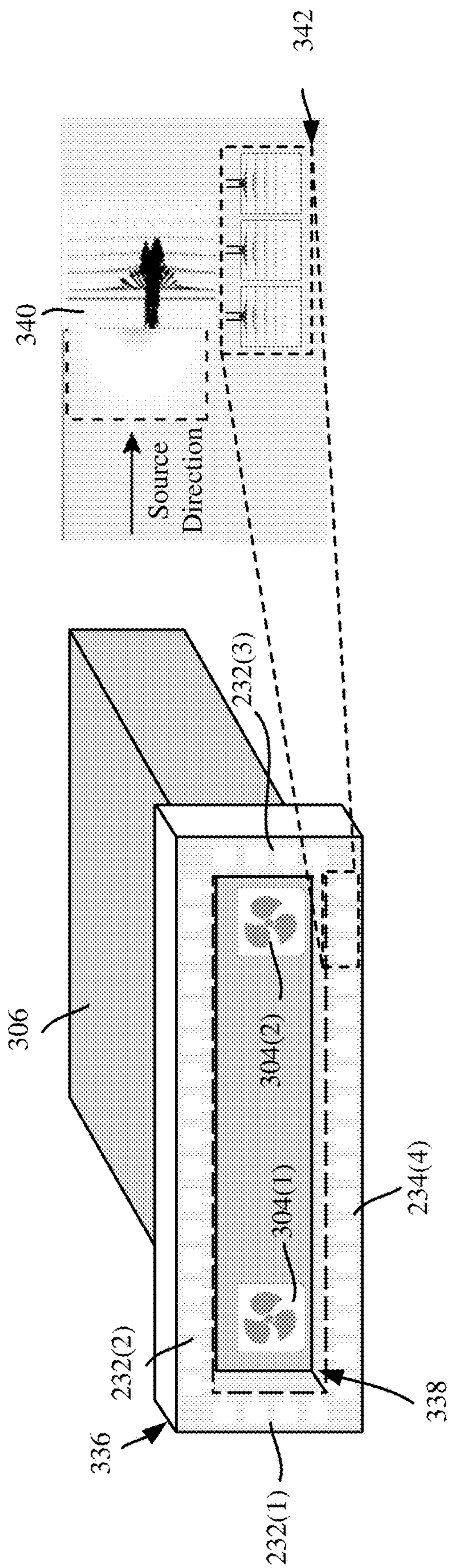
FIG. 3 is a is a three-dimensional (3D) perspective view representation of metasurface modules deployed proximate to a server for noise cancellation, in accordance with various example embodiments and implementations of the subject disclosure.

More particularly, FIG. 3 shows the concept of the four metasurfaces 232(1)-232(4) of unit cell resonators configured as a frame 336 with a slot opening 338 via which the fans 304(1) and 304(2) of the server 306 are visible. The slot opening 338 allows air to flow through the frame 336 substantially unobstructed to the surrounding environment.

As generally represented in FIG. 3, when incident sound waves (block 340) interact with the metasurfaces, the variable Helmholtz resonators (three of which are enlarged in dashed block 342) within the array selectively absorb the corresponding frequencies via inverse phase cancellation. As sound waves enter the resonators (e.g., the resonator 118) through the neck port, they create pressure fluctuations within the cavities. By engineering the geometrical parameters of the cavity/air chamber, the resulting resonance frequency of each unit cell creates a $\pi$ phase shift reflected wave with respect to the incident wave, in which the two sets of waves with opposite phase cancel, effectively absorbing the frequency. Note that these pressure fluctuations also cause the air inside the cavities to oscillate, effectively converting acoustic energy into kinetic energy. This kinetic energy is then dissipated as heat through viscous losses in the narrow neck of the resonators, however the heat dissipation is appreciably better relative to traditional sound absorbers and does not significantly affect thermal performance of a server.

A Helmholtz resonator generally includes a cavity and a narrow neck or opening. When sound waves enter the resonator, the air inside the cavity oscillates at a specific resonant frequency, which depends on the size and shape of the cavity and neck. At the resonant frequency, the resonator effectively absorbs and dampens the sound waves, reducing the amplitude of the noise, which makes it particularly useful for targeting specific unwanted frequencies.

Figure 4:
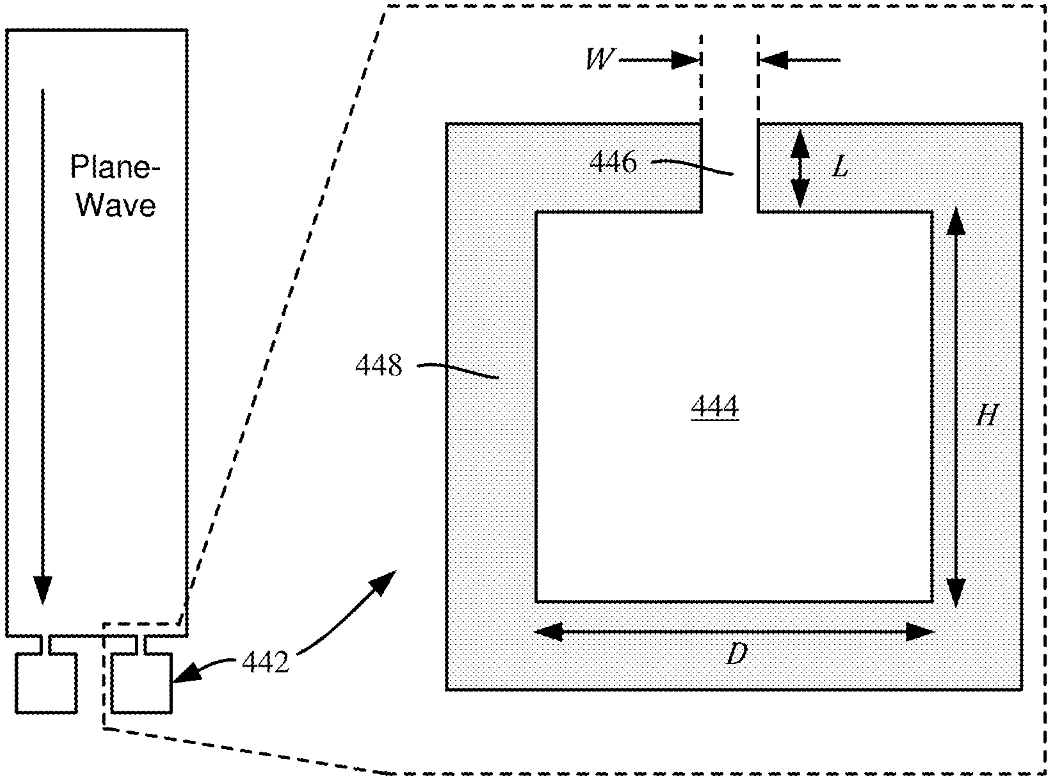
FIG. 4 is a two-dimensional side view representation of example unit-cells including one enlarged unit cell showing various dimensions that determine the unit cell's resonance frequency, in accordance with various example embodiments and implementations of the subject disclosure.

More particularly, as generally represented in FIG. 4, each unit cell 442 comprises a cavity, or air chamber 444, often with a neck port 446 that exposes the air chamber to the air/incoming sound waves, with dimensions engineered to target a particular frequency or a narrowband range of frequencies of interest. That is, the dimensions of the air chamber 444 and neck port 446 for a given unit cell are designed based on generally desired narrow band of acoustic frequencies to cancel. The unit cells, e.g., arrayed in a pattern on a metasurface, allow the unit cells of the metasurface to resonate at their corresponding frequencies when exposed to sound waves of those frequencies. When constructed, e.g., as part of the 3D printing of the metasurface structure, the air chamber 444 and neck port 446, which are hollow to contain air, are enclosed in a supporting structure 448 through which the neck port 446 extends to couple the chamber 444 to the air propagating the sound wave.

The unit cells are based on the principles of Helmholtz resonators, which are acoustic cavities with a small neck port or opening that are highly effective at absorbing specific frequencies via resonance. For example, the resonant frequency ($f_{resonance}$) of a classical Helmholtz resonator with respect to frequencies in the audible range is determined by:

$$f_{resonance} = \frac{c}{2\pi}\sqrt{\frac{S}{L_p V}}$$

where c is the speed of sound, S is the neck port cross-sectional area, $L_p = L_{neck} + 1.7r_{neck}$ (for a cylindrical neck port) and V is the unit cell's cavity chamber's volume.

The unit cells are thus inherently incorporated into the metasurfaces 232(1)-232(4) (FIG. 2), which can then be positioned to cancel the noise source at the determined frequency. In one implementation, each metasurface 232(1)-232(4) contains an array of the unit cell resonator units arranged in a two-dimensional pattern. For absorbing a server's fan noise, for example, the metasurfaces 232(1)-232(4) can be positioned proximate to the server's location as shown in FIGS. 1 and 3.

Figure 5:
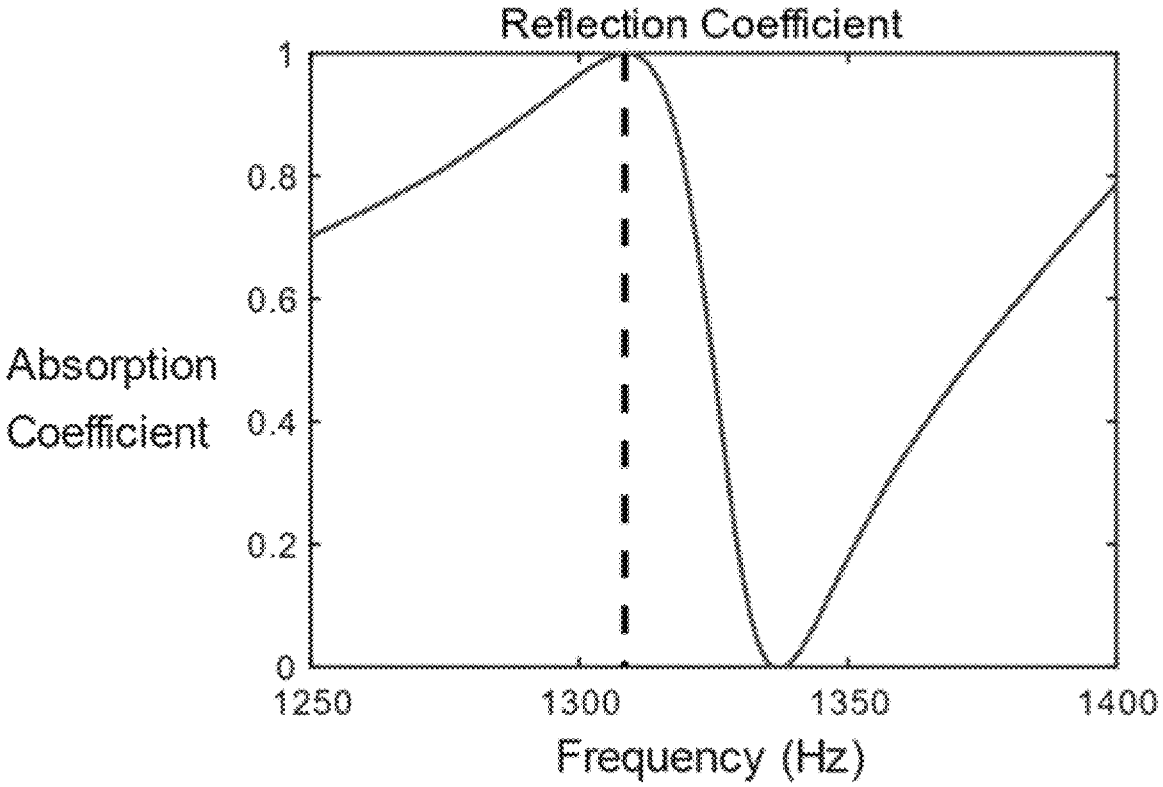
FIG. 5 is a graphical representation of resulting absorption coefficient values of unit cell(s) over a range of frequencies, including a very high absorption coefficient value at the designed frequency 1310 Hz, in accordance with various example embodiments and implementations of the subject disclosure.

The result is highly efficient sound absorption at specific frequencies as shown in FIG. 5, which in this example is around 1310 Hz, making this metasurface particularly useful for targeted noise reduction in environments where controlling specific frequencies is beneficial, such as in architectural acoustics, automotive design, and industrial settings. The dimensions are deep subwavelength values relative to the subwavelength of the incoming wave. For example, one metasurface implementation was designed to inverse phase cancel an incoming frequency 1310 Hz, with selected unit-cell dimensions of D=18 mm, H=16 mm, L=6 mm, W=3.2 mm. The resulting absorption coefficient of the designed unit-cell achieved near-perfect (greater than 98 percent absorption at the designed frequency 1310 Hz), as shown in FIG. 5. As can be seen from this example, the structure is deeply sub-wavelength; the wavelength λ at 1310 Hz in air is 260 mm, which is controlled by unit-cell with thickness of 22 mm. As can be seen, the above-selected dimensions of D, H, L and W for 1310 hertz (1=260 m) in air range from about λ/14 to λ/81 (or λ/13 if based on the thickness of 22 mm). Note that while the curve of FIG. 5 shows about seventy percent absorption effectiveness around 1250 Hz increasing to the peak absorption at the desired frequency 1310 Hz, the curve can be flattened more around the designed frequency to an extent, e.g., by slightly tweaking the dimensions of some of the unit cells.

The designed unit cell only needs air and its surrounding acoustic hard boundaries. This is different from other approaches using porous and fibrous materials and gradient index materials. The materials and the compact design in mm-scale/deeply sub-wavelength facilitate fabricating the unit cell as a thin, light-weight, and cost effective absorber with 3D printing technology.

To summarize thus far, described is a metamaterial metasurface whose internal geometry allows it to interact with sound waves effectively, regardless of their orientation to the airflow. The metasurface is designed to minimize disruption to airflow while still providing effective noise absorption. In simulations, the metasurface has demonstrated considerable noise suppression when placed parallel to the airflow; this solves the tradeoff between thermal management and noise suppression, by achieving noise suppression for a generally static noise profile while not sacrificing the thermal management.

Figure 6A:
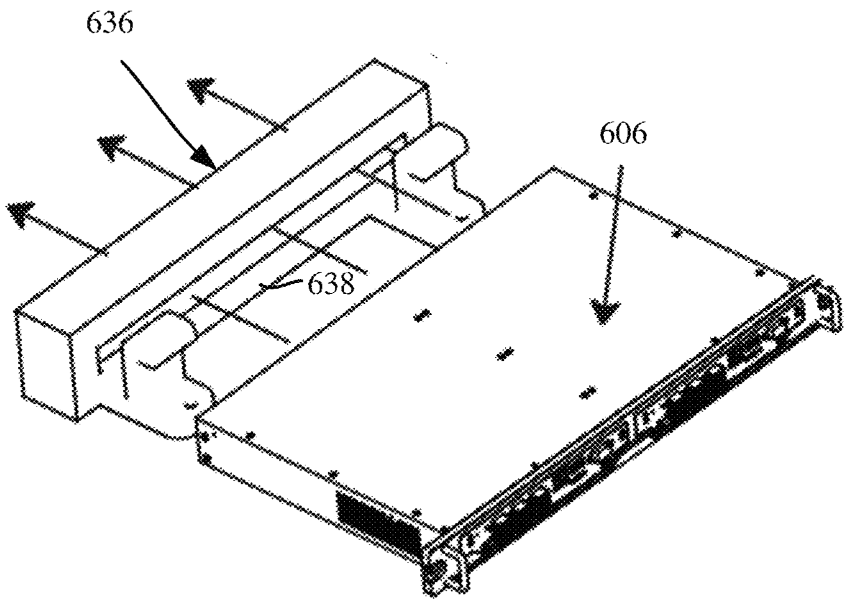
FIG. 6A is a 3D perspective view representation showing how a frame structure of metasurfaces can be coupled to a server for noise cancelation, in accordance with various example embodiments and implementations of the subject disclosure.
Figure 6B:
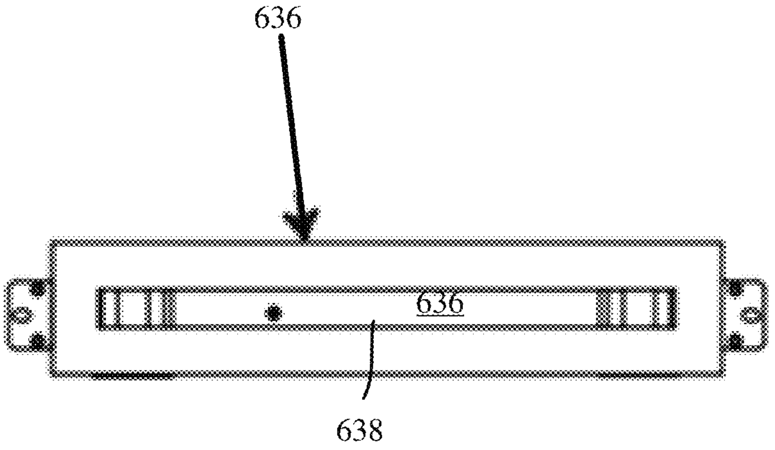
FIG. 6B is a front view representation of FIG. 6A, in accordance with various example embodiments and implementations of the subject disclosure.
Figure 7:
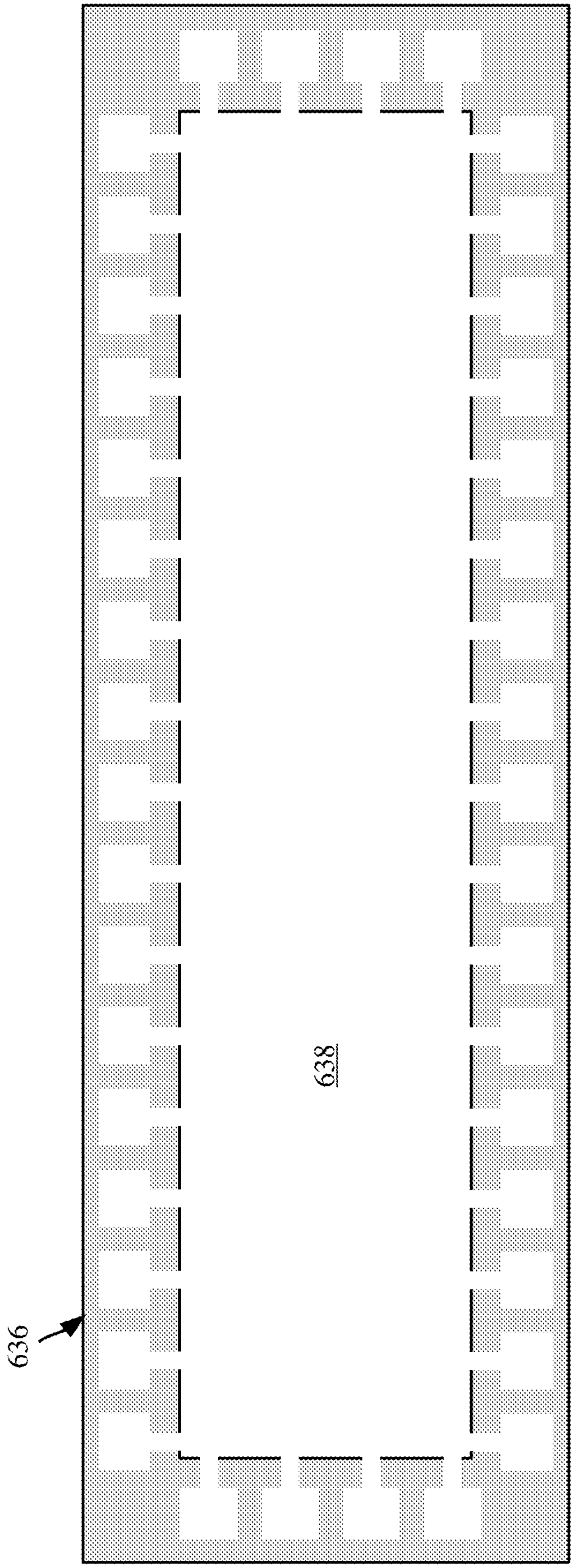
FIG. 7 is a side view representation of example noise canceling Helmholtz resonator metasurface modules deployed in a frame structure with a frame opening for coupling to a server, in accordance with various example embodiments and implementations of the subject disclosure.

FIGS. 6A, 6B and 7 show the concept of a device-specific noise absorbing metasurface as an add-on feature to an individual server unit 606, in which the noise absorbing metasurface is configured as a frame structure 636 (as in FIG. 3). The slot opening 638 allows the air to flow through the frame structure 636, as represented by the arrows in FIG. 6A.

To address the noise from individual server fans operating at specific frequencies, we propose a device-specific noise suppression solution. Our design features a customized metasurface tailored to each particular server or device. This solution is versatile and does not need to be integrated during the manufacturing process; instead, it functions as an add-on that can be purchased separately. The hollow rectangular frame lined with metasurfaces preserves thermal efficiency by allowing unobstructed airflow. This frame can be easily attached to existing server devices using a latch, clamp or other non-intrusive mechanisms, providing an effective and convenient noise reduction solution without compromising thermal performance.

FIG. 7 shows the Helmholtz resonator unit cells (air cavities) around the frame structure 636. Although the unit cells are perpendicular to the direction of the airflow, significant noise absorption results, without significantly obstructing the airflow because of the frame structure 626 with its opening 638.

Figure 8:
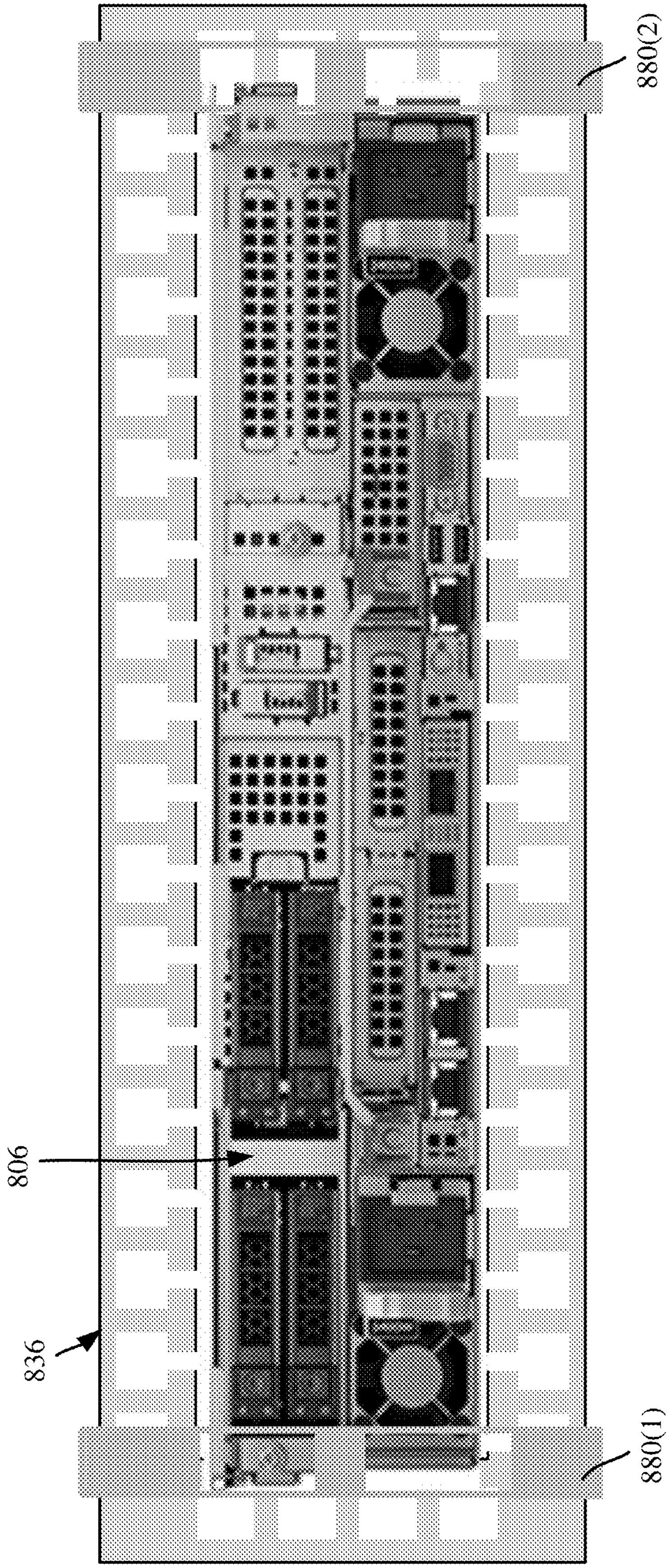
FIG. 8 is a back view representation showing a frame structure coupled to a server, in accordance with various example embodiments and implementations of the subject disclosure.

FIG. 8 shows the frame structure 836 as a device-specific noise absorbing add-on feature for an individual unit, in which the noise absorbing frame (or shell-like) structure 836 can be an attachable accessory. The resonator cells are faced inward, perpendicular to the direction of airflow. The unit cells can be designed specifically for the noise profile for that type of device, e.g., as a customization option for the device. This feature can be oriented to edge computing, minimizing the noise while ensuring thermal performance.

Figure 9:
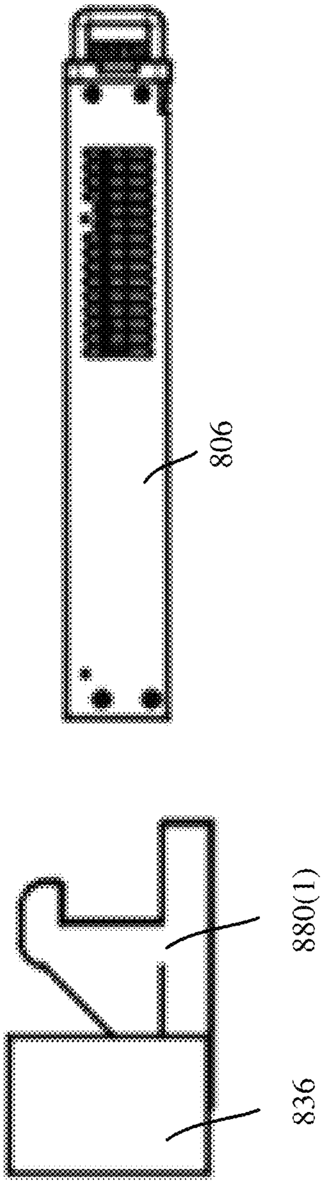
FIGS. 9 and 10 are side view and top view representations, respectively, showing a non-liming mechanical coupling mechanism for attaching a metasurface frame structure to a server, in accordance with various example embodiments and implementations of the subject disclosure.
Figure 10:
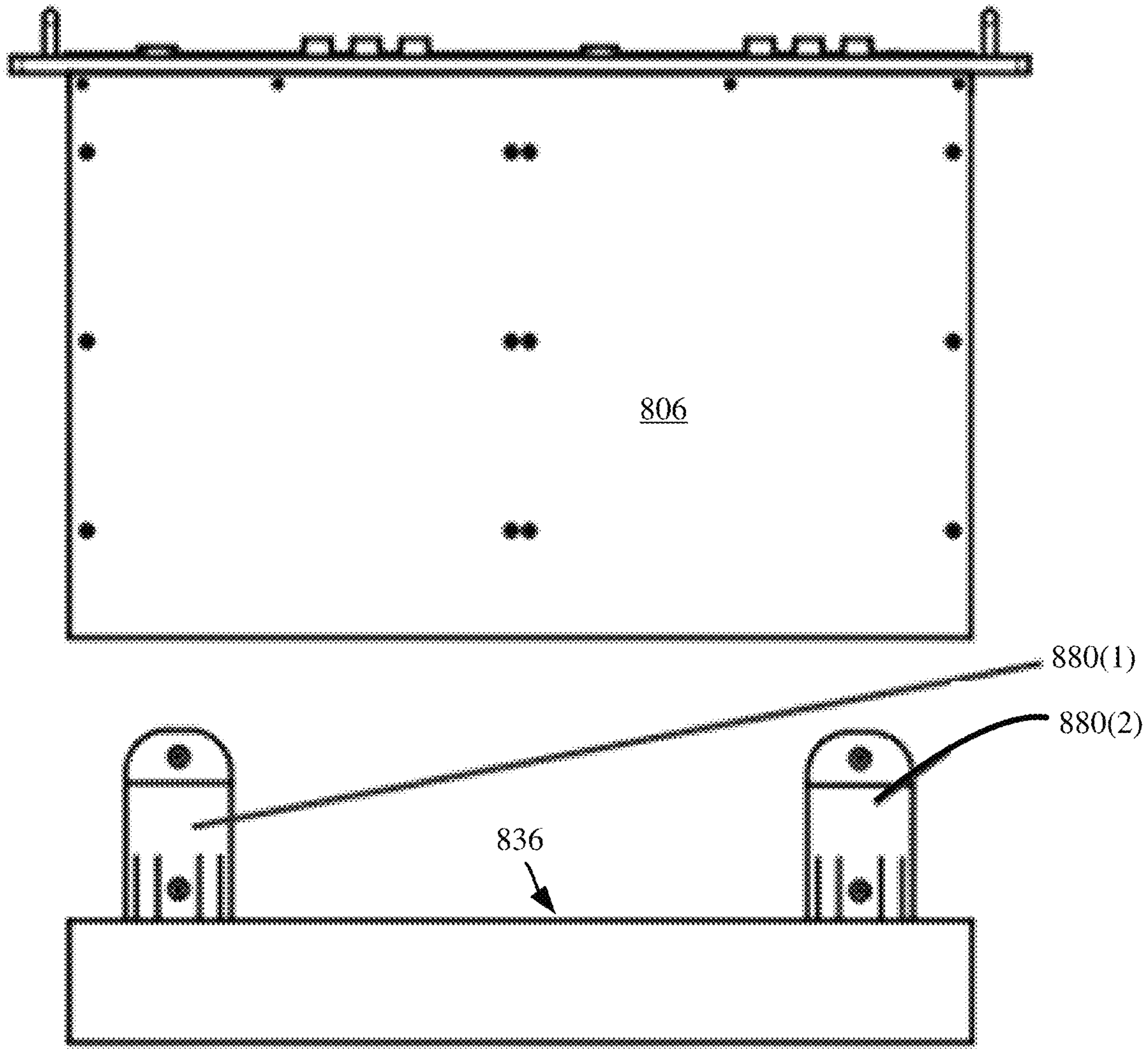

FIG. 8, along with FIGS. 9 (side view) and 10 (bottom view), also show one non-limiting example mechanical couplings 880(1) and 880(2), e.g., brackets or clamps, for attaching the frame structure 836 to the housing of the server 806. The mechanical couplings 880(1) and 880(2) can, for example, clamp (via a spring or screw-like mechanism) to the server 806 so that the server surfaces are not compromised. Further, the mechanical couplings 880(1) and 880(2) can be customized for a given server type, or can slide laterally so as to be positioned at a location that does not interfere with airflow or access to the ports and the like at the back of the server 806. Openings in the bracket can be provided to provide access as well.

One or more implementations and embodiments can be included in a system, such as described and represented in the drawing figures herein. The system can include an acoustic metasurface comprising Helmholtz resonators, in which the acoustic metasurface is configured for deployment of the acoustic metasurface proximate to a server housing of a server via a coupling. When the acoustic metasurface is coupled proximate to the server housing via the coupling, the acoustic metasurface extends beyond the server housing in a direction corresponding to airflow emitted by at least one fan of the server, to facilitate unobstructed or substantially unobstructed airflow from the at least one fan to a surrounding environment in conjunction with suppressing at least some noise generated by the at least one fan.

When the acoustic metasurface is coupled proximate to the server housing, the acoustic metasurface can be substantially parallel to a top surface of the server.

When the acoustic metasurface is coupled proximate to the server housing, the acoustic metasurface can be substantially parallel to a side surface of the server.

The Helmholtz resonators can be respective Helmholtz resonators that can include respective open cavities, and, when coupled to the server via the coupling, the respective open cavities can be substantially perpendicular to the top surface of the server housing.

The coupling can include a first side latch or clamp and a second side latch or clamp; the first side latch or clamp can be configured to attach to the top surface and a bottom surface of the server housing, proximate to a first side of the server housing, and the second side latch or clamp can be configured to attach to the top surface and the bottom surface of the server housing proximate to a second side of the server housing.

The acoustic metasurface can be formed by a three-dimensional printer that prints the acoustic metasurface as a solid structure in layers, in conjunction with omitting printing of the Helmholtz resonators.

The acoustic metasurface can be a first acoustic metasurface including first Helmholtz resonators configured for deployment proximate to the top surface of the housing. The system further can include a second acoustic metasurface, which can include second Helmholtz resonators configured for coupling proximate to a bottom surface of the housing. When coupled proximate to the server via the coupling, the second acoustic metasurface extends beyond the housing in the direction corresponding to the airflow emitted by the at least one fan of the server, to facilitate unobstructed or substantially unobstructed airflow from the at least one fan to the surrounding environment in conjunction with suppressing at least some other noise generated by the at least one fan other than the at least some noise.

The system further can include a metasurface frame structure, in which the first acoustic metasurface is integrated within a top part of the metasurface frame structure, the second acoustic metasurface is integrated within a bottom part of the metasurface frame structure. The metasurface frame structure can include a centralized slot opening between the top part and the bottom part through which the airflow emitted by the at least one fan flows, unobstructed or substantially unobstructed by the metasurface frame structure.

The metasurface frame structure can be formed by a three-dimensional printer that prints the first acoustic metasurface integrated within the metasurface frame structure as a solid structure in layers, in conjunction with omitting printing of the first Helmholtz resonators, and prints the second acoustic metasurface integrated within the metasurface frame structure as a solid structure in layers, in conjunction with omitting printing of the second Helmholtz resonators.

The system further can include a third metasurface that can include third Helmholtz resonators, and a fourth metasurface that can include fourth Helmholtz resonators. The third acoustic metasurface can be integrated within a first side part of the metasurface frame structure, the fourth acoustic metasurface can be integrated within a second side part of the metasurface frame structure, and the centralized slot opening can be between the first side part and the second side part.

The metasurface frame structure can be formed by a three-dimensional printer that prints the first acoustic metasurface integrated within the metasurface frame structure as a first solid structure in first layers, in conjunction with omitting printing of the first Helmholtz resonators, prints the second acoustic metasurface integrated within the metasurface frame structure as a second solid structure in second layers, in conjunction with omitting printing of the second Helmholtz resonators, prints the third acoustic metasurface integrated within the metasurface frame structure as a third solid structure in third layers, in conjunction with omitting printing of the third Helmholtz resonators, and prints the fourth acoustic metasurface integrated within the metasurface frame structure as a fourth solid structure in fourth layers, in conjunction with omitting printing of the fourth Helmholtz resonators.

One or more implementations and embodiments can be included in a system, such as described and represented in the drawing figures herein. The system can include a first acoustic metasurface including first Helmholtz resonators; the first acoustic metasurface can be coupled proximate to a top surface of a server housing. The system can include a second acoustic metasurface including second Helmholtz resonators; the second acoustic metasurface can be coupled proximate to a bottom surface of the server housing. The first acoustic metasurface can extend beyond the top surface of the server housing in a direction that is parallel or substantially parallel to the top surface and that corresponds to airflow emitted by at least one fan of the server, to facilitate substantially unobstructed airflow from the at least one fan to a surrounding environment in conjunction with suppressing a first amount of noise generated by the at least one fan. The second acoustic metasurface can extend beyond the top surface of the server housing in a direction that is parallel or substantially parallel to the bottom surface and that corresponds to airflow emitted by at least one fan of the server, to facilitate substantially unobstructed airflow from the at least one fan to a surrounding environment in conjunction with suppressing a second amount of noise generated by the at least one fan.

The first acoustic metasurface can be integrated into a top portion of a metasurface frame structure, the second acoustic metasurface is integrated into a bottom portion of the metasurface frame structure, the metasurface frame structure can couple to the server housing with the first acoustic metasurface coupled proximate to the top surface of the server housing and the second acoustic metasurface coupled proximate to the bottom surface of the server housing, and the metasurface frame structure can include an opening between the first acoustic metasurface and the second acoustic metasurface to facilitate substantially unobstructed airflow between the first acoustic metasurface and the second acoustic metasurface.

The system further can include a third acoustic metasurface and a fourth acoustic metasurface; the third acoustic metasurface can be integrated into a first side of the metasurface frame structure, the second acoustic metasurface can be integrated into a second side of the metasurface frame structure, and the opening can be between the third acoustic metasurface and the fourth acoustic metasurface.

The metasurface frame structure can mechanically couple to the server housing.

The metasurface frame structure can mechanically couples to the server housing via a first latch or clamp coupled proximate to a first side of the metasurface frame structure, and via a second latch or clamp coupled proximate to a second side of the metasurface frame structure.

One or more implementations and embodiments can be included in a system, such as described and represented in the drawing figures herein. The system can include a metasurface frame configured to be coupled to a server housing. The metasurface frame structure can include a first acoustic metasurface that can include first Helmholtz resonators, and the first acoustic metasurface can be incorporated into a top wall of the metasurface frame. The metasurface frame structure can include a second acoustic metasurface that can include second Helmholtz resonators; the second acoustic metasurface can be incorporated into a bottom wall of the metasurface frame. The metasurface frame structure can include a slot opening between the top wall and the bottom wall. When the metasurface frame is coupled to server housing, at least part of the metasurface frame extends beyond the server housing in a direction that corresponds to airflow emitted by at least one fan of the server, to facilitate decreasing or eliminating obstruction of airflow through the slot opening from the at least one fan to a surrounding environment, in conjunction with suppressing noise generated by the at least one fan via the first acoustic metasurface and the second acoustic metasurface.

The system further can include a third acoustic metasurface that can include third Helmholtz resonators, in which the third acoustic metasurface can be incorporated into a left wall of the metasurface frame, and a fourth acoustic metasurface that can include fourth Helmholtz resonators, in which the fourth acoustic metasurface can be incorporated into a right wall of the metasurface frame. The slot opening can be between the left wall and the right wall.

The system further can include at least one coupling configured to attach the metasurface frame to the server housing proximate to a side of the server housing from which the airflow emitted from the at least one fan exits the server housing. The at least one coupling can be configured to facilitate decreasing or eliminating the obstruction of airflow from the at least one fan to the surrounding environment.

As can be seen, the technology described herein facilitates construction and deployment of modular metasurface(s) of unit cells that can be deployed for a server, e.g., behind the server's fans. The metasurfaces can be implemented in a practical, compact and lightweight surface configuration, including a frame structure through which the air flows from the server's fans parallel to the metasurfaces and perpendicular to the unit cells, flowing substantially unobstructed to the surrounding environment. As one example, the metasurface is highly useful in the context of mitigating server noise. One unit-cell design achieved high sound absorption of an incoming sound wave at the frequency for which it was designed. Based on the technology described herein, thin, light-weight, and cost effective sound absorbers can be constructed, including by using 3D printing technology.

The above description of illustrated embodiments of the subject disclosure, comprising what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

As used in this application, the terms "component," "system," "platform," "layer," "selector," "interface," and the like are intended to refer to a computer-related resource or an entity related to an operational apparatus with one or more specific functionalities, wherein the entity can be either hardware, a combination of hardware and software, software, or software in execution. As an example, a component can be an apparatus with specific functionality provided by mechanical parts operated by electric or electronic circuitry. As yet another example, a component can be an apparatus that provides specific functionality through electronic components without mechanical parts, the electronic components can comprise a processor therein to execute software or firmware that confers at least in part the functionality of the electronic components.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances.

While the embodiments are susceptible to various modifications and alternative constructions, certain illustrated implementations thereof are shown in the drawings and have been described above in detail. It should be understood, however, that there is no intention to limit the various embodiments to the specific forms disclosed, but on the contrary, the intention is to cover all modifications, alternative constructions, and equivalents falling within the spirit and scope.

In addition to the various implementations described herein, it is to be understood that other similar implementations can be used or modifications and additions can be made to the described implementation(s) for performing the same or equivalent function of the corresponding implementation(s) without deviating therefrom. Still further, multiple processing chips or multiple devices can share the performance of one or more functions described herein, and similarly, storage can be effected across a plurality of devices. Accordingly, the various embodiments are not to be limited to any single implementation, but rather are to be construed in breadth, spirit and scope in accordance with the appended claims.

What is claimed is:

1. A system, comprising:

an acoustic metasurface comprising Helmholtz resonators, wherein the acoustic metasurface is configured for deployment of the acoustic metasurface proximate to a server housing of a server via a coupling, wherein, when the acoustic metasurface is coupled proximate to the server housing via the coupling, the acoustic metasurface extends beyond the server housing in a direction corresponding to airflow emitted by at least one fan of the server, to facilitate unobstructed or substantially unobstructed airflow from the at least one fan to a surrounding environment in conjunction with suppressing at least some noise generated by the at least one fan, wherein the Helmholtz resonators are configured to suppress noise via inverse phase cancellation, and wherein each of the Helmholtz resonators creates, at respective resonance frequencies of the Helmholtz resonators, a reflected wave comprising a phase that is approximately π radians shifted relative to an incident sound wave, to destructively cancel noise generated by the at least one fan.

2. The system of claim 1, wherein, when the acoustic metasurface is coupled proximate to the server housing, the acoustic metasurface is substantially parallel to a top surface of the server.

3. The system of claim 1, wherein, when the acoustic metasurface is coupled proximate to the server housing, the acoustic metasurface is substantially parallel to a side surface of the server.

4. The system of claim 1, wherein the Helmholtz resonators are respective Helmholtz resonators that comprise respective open cavities, and wherein, when coupled to the server via the coupling, the respective open cavities are substantially perpendicular to a top surface of the server housing.

5. The system of claim 1, wherein the coupling comprises a first side latch or clamp and a second side latch or clamp, wherein the first side latch or clamp is configured to attach to a top surface and a bottom surface of the server housing, proximate to a first side of the server housing, and wherein the second side latch or clamp is configured to attach to the top surface and the bottom surface of the server housing proximate to a second side of the server housing.

6. The system of claim 1, wherein the acoustic metasurface is formed by a three-dimensional printer that prints the acoustic metasurface as a solid structure in layers, in conjunction with omitting printing of the Helmholtz resonators.

7. The system of claim 1, wherein the acoustic metasurface is a first acoustic metasurface comprising first Helmholtz resonators configured for deployment proximate to a top surface of the server housing, and further comprising a second acoustic metasurface comprising second Helmholtz resonators configured for coupling proximate to a bottom surface of the server housing, wherein, when coupled proximate to the server via the coupling, the second acoustic metasurface extends beyond the server housing in the direction corresponding to the airflow emitted by the at least one fan of the server, to facilitate unobstructed or substantially unobstructed airflow from the at least one fan to the surrounding environment in conjunction with suppressing at least some other noise generated by the at least one fan other than the at least some noise.

8. The system of claim 7, further comprising a metasurface frame structure, wherein the first acoustic metasurface is integrated within a top part of the metasurface frame structure, wherein the second acoustic metasurface is integrated within a bottom part of the metasurface frame structure, and wherein the metasurface frame structure comprises a centralized slot opening between the top part and the bottom part through which the airflow emitted by the at least one fan flows, unobstructed or substantially unobstructed by the metasurface frame structure.

9. The system of claim 8, wherein the metasurface frame structure is formed by a three-dimensional printer that:

prints the first acoustic metasurface integrated within the metasurface frame structure as a solid structure in layers, in conjunction with omitting printing of the first Helmholtz resonators, and prints the second acoustic metasurface integrated within the metasurface frame structure as a solid structure in layers, in conjunction with omitting printing of the second Helmholtz resonators.

10. The system of claim 8, further comprising a third acoustic metasurface comprising third Helmholtz resonators, and a fourth acoustic metasurface comprising fourth Helmholtz resonators, wherein the third acoustic metasurface is integrated within a first side part of the metasurface frame structure, wherein the fourth acoustic metasurface is integrated within a second side part of the metasurface frame structure, and wherein the centralized slot opening is between the first side part and the second side part.

11. The system of claim 10, wherein the metasurface frame structure is formed by a three-dimensional printer that:

prints the first acoustic metasurface integrated within the metasurface frame structure as a first solid structure in first layers, in conjunction with omitting printing of the first Helmholtz resonators, prints the second acoustic metasurface integrated within the metasurface frame structure as a second solid structure in second layers, in conjunction with omitting printing of the second Helmholtz resonators, prints the third acoustic metasurface integrated within the metasurface frame structure as a third solid structure in third layers, in conjunction with omitting printing of the third Helmholtz resonators, and prints the fourth acoustic metasurface integrated within the metasurface frame structure as a fourth solid structure in fourth layers, in conjunction with omitting printing of the fourth Helmholtz resonators.

12. A system, comprising:

a first acoustic metasurface comprising first Helmholtz resonators, wherein the first acoustic metasurface is coupled proximate to a top surface of a server housing; and a second acoustic metasurface comprising second Helmholtz resonators, wherein the second acoustic metasurface is coupled proximate to a bottom surface of the server housing, wherein the first acoustic metasurface extends beyond the top surface of the server housing in a direction that is parallel or substantially parallel to the top surface and that corresponds to airflow emitted by at least one fan of a server, to facilitate substantially unobstructed airflow from the at least one fan to a surrounding environment in conjunction with suppressing a first amount of noise generated by the at least one fan, wherein the second acoustic metasurface extends beyond the bottom surface of the server housing in a direction that is parallel or substantially parallel to the bottom surface and that corresponds to airflow emitted by at least one fan of the server, to facilitate substantially unobstructed airflow from the at least one fan to a surrounding environment in conjunction with suppressing a second amount of noise generated by the at least one fan, wherein the first Helmholtz resonators and the second Helmholtz resonators are configured to suppress noise via inverse phase cancellation, and wherein each of the first Helmholtz resonators and each of the second Helmholtz resonators creates, at respective resonance frequencies of the first Helmholtz resonators and the second Helmholtz resonators, a reflected wave comprising a phase that is approximately π radians shifted relative to an incident sound wave, to destructively cancel noise generated by the at least one fan.

13. The system of claim 12, wherein the first acoustic metasurface is integrated into a top portion of a metasurface frame structure, wherein the second acoustic metasurface is integrated into a bottom portion of the metasurface frame structure, wherein the metasurface frame structure couples to the server housing with the first acoustic metasurface coupled proximate to the top surface of the server housing and the second acoustic metasurface coupled proximate to the bottom surface of the server housing, and wherein the metasurface frame structure comprises an opening between the first acoustic metasurface and the second acoustic metasurface to facilitate substantially unobstructed airflow between the first acoustic metasurface and the second acoustic metasurface.

14. The system of claim 13, further comprising a third acoustic metasurface and a fourth acoustic metasurface, wherein the third acoustic metasurface is integrated into a first side of the metasurface frame structure, wherein the second acoustic metasurface is integrated into a second side of the metasurface frame structure, and wherein the opening is between the third acoustic metasurface and the fourth acoustic metasurface.

15. The system of claim 13, wherein the metasurface frame structure mechanically couples to the server housing.

16. The system of claim 13, wherein the metasurface frame structure mechanically couples to the server housing via a first latch or clamp coupled proximate to a first side of the metasurface frame structure, and via a second latch or clamp coupled proximate to a second side of the metasurface frame structure.

17. A system, comprising:

a metasurface frame configured to be coupled to a server housing, the metasurface frame comprising:

a first acoustic metasurface comprising first Helmholtz resonators, the first acoustic metasurface incorporated into a top wall of the metasurface frame;

a second acoustic metasurface comprising second Helmholtz resonators, the second acoustic metasurface incorporated into a bottom wall of the metasurface frame; and a slot opening between the top wall and the bottom wall, wherein, when the metasurface frame is coupled to the server housing, at least part of the metasurface frame extends beyond the server housing in a direction that corresponds to airflow emitted by at least one fan of a server, to facilitate decreasing or eliminating obstruction of airflow through the slot opening from the at least one fan to a surrounding environment, in conjunction with suppressing noise generated by the at least one fan via the first acoustic metasurface and the second acoustic metasurface, wherein the first Helmholtz resonators and the second Helmholtz resonators are configured to suppress noise via inverse phase cancellation, and wherein each of the first Helmholtz resonators and each of the second Helmholtz resonators creates, at respective resonance frequencies of the first Helmholtz resonators and the second Helmholtz resonators, a reflected wave comprising a phase that is approximately $\pi$ radians shifted relative to an incident sound wave, to destructively cancel noise generated by the at least one fan.

18. The system of claim 17, further comprising a third acoustic metasurface comprising third Helmholtz resonators, the third acoustic metasurface incorporated into a left wall of the metasurface frame, and a fourth acoustic metasurface comprising fourth Helmholtz resonators, the fourth acoustic metasurface incorporated into a right wall of the metasurface frame, wherein the slot opening is between the left wall and the right wall.

19. The system of claim 17, further comprising at least one coupling configured to attach the metasurface frame to the server housing proximate to a side of the server housing from which the airflow emitted from the at least one fan exits the server housing.

20. The system of claim 19, wherein the at least one coupling is configured to facilitate decreasing or eliminating the obstruction of airflow from the at least one fan to the surrounding environment.

* * * * *